United States Patent
Poilasne et al.

(10) Patent No.: US 8,237,620 B2
(45) Date of Patent: Aug. 7, 2012

(54) RECONFIGURABLE RADIATION DENSENSITIVITY BRACKET SYSTEMS AND METHODS

(75) Inventors: Gregory Poilasne, San Diego, CA (US); Jorge Fabrega-Sanchez, San Diego, CA (US)

(73) Assignee: KYOCERA Corporation, Kyoto (JP)

( * ) Notice: Subject to any disclaimer, the term of this patent is extended or adjusted under 35 U.S.C. 154(b) by 311 days.

(21) Appl. No.: 12/698,091

(22) Filed: Feb. 1, 2010

(65) Prior Publication Data
US 2010/0127950 A1      May 27, 2010

Related U.S. Application Data

(60) Division of application No. 10/940,206, filed on Sep. 14, 2004, now Pat. No. 7,746,292, which is a continuation-in-part of application No. 10/775,722, filed on Feb. 9, 2004, now Pat. No. 6,937,195, which is a continuation-in-part of application No. 10/120,603, filed on Apr. 9, 2002, now Pat. No. 6,885,341.

(60) Provisional application No. 60/283,093, filed on Apr. 11, 2001.

(51) Int. Cl.
*H01Q 1/48* (2006.01)
(52) U.S. Cl. .................. 343/846; 343/700 MS
(58) Field of Classification Search .................. 343/700, 343/829, 846, 904
See application file for complete search history.

(56) References Cited

U.S. PATENT DOCUMENTS

| | | |
|---|---|---|
| 3,239,838 A | 3/1966 | Kelleher |
| 3,413,543 A | 11/1968 | Schubring et al. |
| 3,676,803 A | 7/1972 | Simmons |
| 3,678,305 A | 7/1972 | Paige |
| 3,680,135 A | 7/1972 | Boyer |
| 3,737,814 A | 6/1973 | Pond |
| 3,739,299 A | 6/1973 | Adler |
| 3,836,874 A | 9/1974 | Maeda et al. |
| 3,918,012 A | 11/1975 | Peuzin |
| 4,122,400 A | 10/1978 | Medendorp et al. |
| 4,197,544 A * | 4/1980 | Kaloi ..................... 343/700 MS |
| 4,236,125 A | 11/1980 | Bernard et al. |

(Continued)

FOREIGN PATENT DOCUMENTS
DE            40 36 866 A1       7/1991
(Continued)

OTHER PUBLICATIONS

Presser, A., "Varactor-Tunable, High-Q Microwave Filter," RCA Review, vol. 42, Dec. 1981, pp. 691-705.

(Continued)

*Primary Examiner* — Tho G Phan

(57) ABSTRACT

A method and device bracket are presented for reconfigurable radiation desensitivity. The method includes: accepting a radiated wave from a source such as a transmitter, antenna, microprocessor, electrical component, integrated circuit, camera, connector, or signal cable; in response to the radiated wave, creating a first current per units square (I/units$^2$) through a groundplane of an electrical circuit such as a printed circuit board (PCB), display, connector, or keypad; accepting a control signal; and, in response to the control signal, creating a second I/units$^2$ through the groundplane. This step couples the groundplane to a bracket having a selectable effective electrical length. Typically, the groundplane is coupled to a bracket with a fixed physical length section to provide a combined effective electrical length responsive to the fixed physical length and the selectable effective electrical length. The coupling mechanism can result from transistor coupling, p/n junction coupling, selectable capacitive coupling, or mechanically bridging.

17 Claims, 7 Drawing Sheets

U.S. PATENT DOCUMENTS

| | | |
|---|---|---|
| 4,475,108 A | 10/1984 | Moser |
| 4,484,157 A | 11/1984 | Helle et al. |
| 4,494,081 A | 1/1985 | Lea et al. |
| 4,525,720 A | 6/1985 | Corzine et al. |
| 4,626,800 A | 12/1986 | Murakami et al. |
| 4,733,328 A | 3/1988 | Blazej |
| 4,736,169 A | 4/1988 | Weaver et al. |
| 4,737,797 A | 4/1988 | Siwiak et al. |
| 4,746,925 A | 5/1988 | Toriyama |
| 4,792,939 A | 12/1988 | Hikita et al. |
| 4,799,066 A | 1/1989 | Deacon |
| 4,835,499 A | 5/1989 | Pickett |
| 4,835,540 A | 5/1989 | Haruyama et al. |
| 4,847,626 A | 7/1989 | Kahler et al. |
| 4,908,853 A | 3/1990 | Matsumoto |
| 4,975,604 A | 12/1990 | Barta |
| 5,162,728 A | 11/1992 | Huppenthal |
| 5,162,743 A | 11/1992 | Kruchowski et al. |
| 5,166,857 A | 11/1992 | Avanic et al. |
| 5,173,709 A | 12/1992 | Lauro et al. |
| 5,212,463 A | 5/1993 | Babbitt et al. |
| 5,216,392 A | 6/1993 | Fraser |
| 5,227,748 A | 7/1993 | Sroka |
| 5,231,407 A | 7/1993 | McGirr et al. |
| 5,293,408 A | 3/1994 | Takahashi et al. |
| 5,307,033 A | 4/1994 | Koscica et al. |
| 5,325,099 A | 6/1994 | Nemit et al. |
| 5,388,021 A | 2/1995 | Stahl |
| 5,406,163 A | 4/1995 | Carson et al. |
| 5,416,803 A | 5/1995 | Janer |
| 5,427,988 A | 6/1995 | Sengupta et al. |
| 5,450,092 A | 9/1995 | Das |
| 5,451,915 A | 9/1995 | Katzin et al. |
| 5,459,123 A | 10/1995 | Das |
| 5,472,935 A | 12/1995 | Yandrofski et al. |
| 5,479,139 A | 12/1995 | Koscica et al. |
| 5,495,215 A | 2/1996 | Newell et al. |
| 5,496,795 A | 3/1996 | Das |
| 5,496,796 A | 3/1996 | Das |
| 5,502,422 A | 3/1996 | Newell et al. |
| 5,525,942 A | 6/1996 | Horii et al. |
| 5,557,286 A | 9/1996 | Varadan et al. |
| 5,561,307 A | 10/1996 | Mihara et al. |
| 5,561,407 A | 10/1996 | Koscica et al. |
| 5,564,086 A | 10/1996 | Cygan et al. |
| 5,574,410 A | 11/1996 | Collins et al. |
| 5,577,025 A | 11/1996 | Skinner |
| 5,583,524 A | 12/1996 | Milroy |
| 5,589,845 A | 12/1996 | Yandrofski et al. |
| 5,600,279 A | 2/1997 | Mori |
| 5,617,104 A | 4/1997 | Das |
| 5,640,042 A | 6/1997 | Koscica et al. |
| 5,649,306 A | 7/1997 | Vanatta et al. |
| 5,652,599 A | 7/1997 | Pitta et al. |
| 5,673,188 A | 9/1997 | Lusher et al. |
| 5,701,595 A | 12/1997 | Green, Jr. |
| 5,711,013 A | 1/1998 | Collett et al. |
| 5,721,194 A | 2/1998 | Yandrofski et al. |
| 5,729,239 A | 3/1998 | Rao |
| 5,764,190 A | 6/1998 | Murch et al. |
| 5,777,524 A | 7/1998 | Wojewoda et al. |
| 5,777,839 A | 7/1998 | Sameshima et al. |
| 5,778,308 A | 7/1998 | Sroka et al. |
| 5,830,591 A | 11/1998 | Sengupta et al. |
| 5,834,975 A | 11/1998 | Bartlett et al. |
| 5,864,932 A | 2/1999 | Evans et al. |
| 5,870,670 A | 2/1999 | Ripley et al. |
| 5,880,921 A | 3/1999 | Tham et al. |
| 5,889,852 A | 3/1999 | Rosecrans et al. |
| 5,892,486 A | 4/1999 | Cook et al. |
| 5,908,811 A | 6/1999 | Das |
| 5,910,994 A | 6/1999 | Lane et al. |
| 5,945,887 A | 8/1999 | Makino et al. |
| 5,965,494 A | 10/1999 | Terashima et al. |
| 5,966,097 A | 10/1999 | Fukasawa et al. |
| 5,973,567 A | 10/1999 | Heal |
| 5,973,568 A | 10/1999 | Shapiro et al. |
| 5,977,917 A | 11/1999 | Hirose |
| 5,986,515 A | 11/1999 | Sakurai |
| 5,987,314 A | 11/1999 | Saito |
| 5,990,766 A | 11/1999 | Zhang |
| 6,008,659 A | 12/1999 | Traynor |
| 6,018,282 A | 1/2000 | Tsuda |
| 6,020,787 A | 2/2000 | Kim et al. |
| 6,026,311 A | 2/2000 | Willemsen Cortes et al. |
| 6,028,561 A | 2/2000 | Takei |
| 6,049,726 A | 4/2000 | Gruenwald et al. |
| 6,052,036 A | 4/2000 | Enstrom et al. |
| 6,054,908 A | 4/2000 | Jackson |
| 6,084,951 A | 7/2000 | Smith et al. |
| 6,094,588 A | 7/2000 | Adam |
| 6,097,263 A | 8/2000 | Mueller et al. |
| 6,101,102 A | 8/2000 | Brand et al. |
| 6,108,191 A | 8/2000 | Bruchhaus et al. |
| 6,160,524 A | 12/2000 | Wilber |
| 6,181,777 B1 | 1/2001 | Kiko |
| 6,198,441 B1 | 3/2001 | Okabe |
| 6,216,020 B1 | 4/2001 | Findikoglu |
| 6,242,843 B1 | 6/2001 | Pohjonen et al. |
| 6,272,336 B1 | 8/2001 | Appel et al. |
| 6,278,383 B1 | 8/2001 | Endo et al. |
| 6,281,023 B2 | 8/2001 | Eastep et al. |
| 6,281,534 B1 | 8/2001 | Arita et al. |
| 6,285,337 B1 | 9/2001 | West et al. |
| 6,292,143 B1 | 9/2001 | Romanofsky |
| 6,294,964 B1 | 9/2001 | Satoh |
| 6,308,051 B1 | 10/2001 | Atokawa |
| 6,310,393 B1 | 10/2001 | Ogura et al. |
| 6,317,083 B1 | 11/2001 | Johnson et al. |
| 6,327,463 B1 | 12/2001 | Welland |
| 6,329,915 B1 | 12/2001 | Brady et al. |
| 6,329,959 B1 | 12/2001 | Varadan et al. |
| 6,333,719 B1 | 12/2001 | Varadan |
| 6,335,710 B1 | 1/2002 | Falk et al. |
| 6,344,823 B1 | 2/2002 | Deng |
| 6,359,444 B1 | 3/2002 | Grimes |
| 6,362,690 B1 | 3/2002 | Tichauer |
| 6,362,784 B1 | 3/2002 | Kane et al. |
| 6,362,789 B1 | 3/2002 | Trumbull et al. |
| 6,384,785 B1 | 5/2002 | Kamogawa et al. |
| 6,404,304 B1 | 6/2002 | Kwon et al. |
| 6,421,016 B1 * | 7/2002 | Phillips et al. ................ 343/702 |
| 6,429,820 B1 | 8/2002 | Thursby et al. |
| 6,456,236 B1 | 9/2002 | Hauck et al. |
| 6,462,628 B2 | 10/2002 | Kondo et al. |
| 6,489,860 B1 | 12/2002 | Ohashi |
| 6,503,786 B2 | 1/2003 | Klodzinski |
| 6,518,850 B1 | 2/2003 | Falk et al. |
| 6,518,920 B2 | 2/2003 | Proctor, Jr. et al. |
| 6,522,220 B2 | 2/2003 | Yamada et al. |
| 6,525,630 B1 | 2/2003 | Zhu et al. |
| 6,525,691 B2 | 2/2003 | Varadan et al. |
| 6,531,936 B1 | 3/2003 | Chiu et al. |
| 6,559,737 B1 | 5/2003 | Nagra et al. |
| 6,571,110 B1 | 5/2003 | Patton et al. |
| 6,600,456 B2 | 7/2003 | Gothard et al. |
| 6,653,977 B1 | 11/2003 | Okabe et al. |
| 6,667,723 B2 | 12/2003 | Forrester |
| 6,686,817 B2 | 2/2004 | Zhu et al. |
| 6,721,293 B1 | 4/2004 | Komulainen et al. |
| 6,727,535 B1 | 4/2004 | Sengupta et al. |
| 6,819,203 B2 | 11/2004 | Taniguchi |
| 6,842,086 B1 | 1/2005 | Zennamo et al. |
| 6,873,294 B1 | 3/2005 | Anderson et al. |
| 6,885,341 B2 | 4/2005 | Tran et al. |
| 6,898,450 B2 | 5/2005 | Eden et al. |
| 6,937,195 B2 | 8/2005 | Fabrega-Sanchez et al. |
| 6,985,113 B2 | 1/2006 | Nishimura et al. |
| 6,987,486 B2 | 1/2006 | Kurienheimo et al. |
| 7,038,635 B2 | 5/2006 | Fukushima et al. |
| 7,079,079 B2 * | 7/2006 | Jo et al. ................ 343/700 MS |
| 2001/0026243 A1 | 10/2001 | Koitsalu et al. |
| 2001/0043159 A1 | 11/2001 | Masuda et al. |
| 2002/0049064 A1 | 4/2002 | Banno |
| 2002/0149526 A1 | 10/2002 | Tran et al. |
| 2002/0149535 A1 | 10/2002 | Toncich |
| 2002/0175878 A1 | 11/2002 | Toncich |

| | | |
|---|---|---|
| 2003/0062971 A1 | 4/2003 | Toncich |
| 2003/0134665 A1 | 7/2003 | Kato et al. |
| 2003/0169206 A1 | 9/2003 | Egawa |
| 2003/0210203 A1* | 11/2003 | Phillips et al. ............... 343/850 |
| 2004/0087280 A1 | 5/2004 | Watanabe et al. |
| 2004/0162047 A1 | 8/2004 | Kasahara et al. |
| 2004/0196121 A1 | 10/2004 | Toncich |
| 2004/0204145 A1 | 10/2004 | Nagatomo |
| 2004/0207722 A1 | 10/2004 | Koyama et al. |
| 2004/0263411 A1 | 12/2004 | Fabrega-Sanchez et al. |
| 2005/0007291 A1 | 1/2005 | Fabrega-Sanchez et al. |

FOREIGN PATENT DOCUMENTS

| | | |
|---|---|---|
| DE | 100 24 483 | 11/2001 |
| DE | 101 37 753 | 2/2003 |
| EP | 0 125 586 | 11/1984 |
| EP | 0 346 089 | 12/1989 |
| EP | 0 473 373 | 3/1992 |
| EP | 0 531 125 | 3/1993 |
| EP | 0 631 399 | 12/1994 |
| EP | 0 637 131 A1 | 2/1995 |
| EP | 0 638 953 A1 | 2/1995 |
| EP | 0 680 108 A1 | 11/1995 |
| EP | 0 795 922 A1 | 9/1997 |
| EP | 0 843 374 A2 | 5/1998 |
| EP | 0 854 567 | 7/1998 |
| EP | 0 872 953 | 10/1998 |
| EP | 0 881 700 A1 | 12/1998 |
| EP | 0 892 459 | 1/1999 |
| EP | 0 909 024 A2 | 4/1999 |
| EP | 1 043 741 A2 | 10/2000 |
| EP | 1 058 333 | 12/2000 |
| EP | 1 248 317 | 10/2002 |
| GB | 2 240 227 | 7/1991 |
| JP | 63 128618 | 6/1988 |
| JP | 05182857 | 7/1993 |
| JP | 29 0500-2001133839 | 7/2001 |
| WO | WO 82/03510 | 10/1982 |
| WO | WO 94/13028 | 6/1994 |
| WO | WO 94/27376 | 11/1994 |
| WO | WO 00/28613 | 5/2000 |
| WO | WO 00/35042 | 6/2000 |
| WO | WO 00/62367 | 10/2000 |
| WO | WO 00/79645 | 12/2000 |
| WO | WO 00/79648 | 12/2000 |
| WO | WO 03/058759 | 7/2001 |
| WO | WO 02/084798 | 10/2002 |

OTHER PUBLICATIONS

Chang, C. et al., "Microwave Active Filters Based on Coupled Negative Resistance Method," IEEE Trans. on Microwave Theory & Techs., vol. 38, No. 12, Dec. 1990, pp. 1879-1884.
Katzin, P. et al., "Narrow-band MMIC Filters with Automatic Tuning and Q-Factor Control," 1993 IEEE MTT-S Int. Microwave Symposium Digest, pp. 403-406.
Hopf, B. et al., "Coplanar MMIC Active Bandpass Filters Using Negative Resistance Circuits," 1994 IEEE MTT-S Symposium Digest, pp. 1183-1185.
Karacaoglu, U. et al., "High Selectivity Varactor-Tuned MMIC Bandpass Filter Using Lossless Active Resonators," 1994 IEEE MTT-Symposium Digest, pp. 1191-1194.
Nauta, B., "A CMOS Transconductance-C Filter Technique for Very High Frequencies," IEEE Journal of Solid-State Circuits, vol. 27, No. 2, Feb. 1992, pp. 142-153.
Fujita, K. et al., "A 15.6 GHz Commercially Based 1/8 GaAs Dynnamic Presealer," 1989 IEEE GaAs IC Symposium, pp. 113-116.
Smuk, J. et al., "MMIC Phase Locked L-S Band Oscillators," 1994 IEEE GaAs Symposium Digest, pp. 27-29.
Chandler, S.R. et al., "Active Varactor Tunable Bandpass Filter," IEEE Microwave and Guided Wave Letters, vol. 3, No. 3, Mar. 1993, pp. 70-71.
Hunter, I.C. et al., "Electronically Tunable Microwave Bandpass Filters," IEEE Trans. on MTT, vol. 30, No. 9, Sep. 1982, pp. 1354-1367.
Toyoda, S., "Quarter-wavelength Coupled Variable Bandstop and Bandpass Filters Using Varactor Diodes," IEEE Trans. on MTT, vol. 30, No. 9, Sep. 1982, pp. 1387-1389.

Yu, B., "Variety of Approaches to Designing Microwave Active Filters," Proc. 27th European Microwave Conference, Jerusalem, vol. 1, 1997, pp. 397-408.
Yu, B., "Understand the Operation of Channelized Active Filters," Microwaves & RF, Jan. 1997, pp. 89-92.
Dishal, M., "Alignment and Adjustment of Synchronously Tuned Multiple Resonator-Circuit Filters," Proc. IRE 39, Nov. 1951, pp. 1448-1455.
Cohn, S.B., "Dissipation Loss in Multiple-Coupled-Resonator Filters," Proc. IRE 47, Aug. 1959, pp. 1342-1348.
Matthael, G.L., "An Electronically Tunable Up-Converter," Proc. IRE 49, Nov. 1961, pp. 1703-1704.
Fubini, E.G. et al., "Minimum Insertion Loss Filters," Proc. IRE 47, Jan. 1959, pp. 37-41.
Getsinger, W.J., "Prototypes for Use in Broadbanding Reflection Amplifiers," IEEE Trans. PTGMTT-11, Nov. 1963, pp. 486-497.
Kuh, E.S. et al., "Optimum Sunthesis of Wide-Band Parametric Amplifiers and Converters," IRE Trans. PCCT-8, Dec. 1961, pp. 410-415.
Getsinger, W.J. et al., "Some Aspects of the Design of Wide-Band Up-Converters and Nondegenerate Parametric Amplifiers," IEEE Trans. PTGMTT-12, Jan 1964, pp. 77-87.
Sleven, R.L., "Design of a Tunable Multi-Cavity Waveguide Band-Pass Filter," 1959 IRE National Convention Record, Part 3, pp. 91-112.
Taub, J.J. et al., "Design of Three-Resonator Dissipative Band-Pass Filters Having Minimum Insertion Loss," Proc. IRE 45, pp. 681-687 (May 1957).
Kotzebue, K.L., "Broadband Electronically-Tunable Microwave Filters," 1960 IRE Wescon Convention Record, Part 1, pp. 21-27.
Louhos, J.P. et al., "Electrical Tuning of Integrated Mobile Phone Antennas," Nokia Mobile Phones, pp. 69-97 (Sep. 15, 1999).
Panayi, P.K. et al., "Tuning Techniques for the Planar Inverted-F Antenna," National Conference on Antennas and Propagation Publication, No. 461, pp. 259-262, (Apr. 1999).
Makioka, S. et al., "A High Efficiency GaAs MCM Power Amplifier for 1.9 GHz Digital Cordless Telephones," IEEE 1994 Microwave & Millimeter-Wave Monolithic Cir. Sym., pp. 51-54.
Varadan, V.K. et al., "Design and Development of Electronically Tunable Microstrip Antennas," IOP Publishing Ltd., pp. 238-242, (1999).
Jose et al., "Experimental Investigations on Electronically Tunable Microstrip Antennas," Microwave and Optical Technology Letters, vol. 20, No. 3, pp. 166-169 (Feb. 5, 1999).
Cuthbert, T. "Broadband Impedance Matching—Fast and Simple", RF Design, Cardiff Publishing Co., vol. 17 No., Nov. 12, 1994 pp. 38, 42, 44, 48 XP000477834.
Erker, et "Monolithic Ka-Band Phase Shifer Using voltage Tunable BaSrTio3 Parallel plate Capacitors", IEEE Micro and Guided Wave Letters, vol. 10 No. 1 Jan. 2000 p. 10-12.
Galt, et al. "Ferroelectric Thin Film Characterization using Superconducting Microstrip Resonators" IEEE Trans on Appl Super. Jun. 1995 IEEE, pp. 2575-2578, vol. 5 No. 2 NJ.
Gevorgian, et al. "HTS/Ferroelectric Devices for Microwave Apps.", IEEE Transactions on applied Super. Jun. 1997 pp. 2458-2461, IEEE USA.
Keis, V.N. et al. "20GHZ tunable filter based on ferroelectric (BaSr)TIO3 Film varactors", Elec. Letters, May 28, 1998, vol. 34, No. 11, IEE Stevenage, GB.
Kozyrev, a, et al. "Ferroelectric Films: Nonlinear Properties and Applications in Microwave Devies" 1998 IEEE MTTT-S Digest, May 1998 pp. 985-988,Baltimore MD, US.
Krautkramer, "Resonanztransformatoren mit drei Reaktanzen als transformierende filter", bulletin Eletrotechnischen Vereins, Zurich CH, vol. 64 #23, Nov. 1973 p. 1500-1509.
Toncich, et al. "Data Reduction Method for Q. Measurments of Stripline Resonators", IEEE Transactions in MTT, vol. 40 No. 9, Sep. 1992 pp. 1833-1836.
Vendik, et al. "1GHz Tunable resonator on bulk single crystal Sr Tio3 plated with Yba2cu307-xfilms" Elec. Letters Apr. 13, 1995 pp, 654-656 vol. 31 #8, IEE Stevenage, GB.

* cited by examiner

RECONFIGURABLE RADIATION DENSENSITIVITY BRACKET SYSTEMS AND METHODS

RELATED APPLICATIONS

This application is a divisional application of U.S. application Ser. No. 10/940,206, filed Sep. 14, 2004 now U.S. Pat. No. 7,746,292, by Gregory Poilasne and Jordi Fabrega-Sanchez, which is hereby incorporated by reference. U.S. application Ser. No. 10/940,206 is a continuation-in-part application of U.S. application Ser. No. 10/775,722, filed Feb. 9, 2004 now U.S. Pat. No. 6,937,195, by Jordi Fabrega-Sanchez, Stanley S. Toncich and Allen Tran, which is hereby incorporated by reference. U.S. application Ser. No. 10/775,722 is a continuation-in-part application of U.S. application Ser. No. 10/120,603, filed Apr. 9, 2002 now U.S. Pat. No. 6,885,341, by Jordi Fabrega-Sanchez, Stanley S. Toncich and Allen Tran, which is hereby incorporated by reference, which claims the benefit of U.S. Provisional Application 60/283,093, filed Apr. 11, 2001, which is hereby incorporated by reference.

In addition, this application relates to the following U.S. applications and patents, which are hereby incorporated by reference: "Reconfigurable Radiation Desensitivity Bracket Systems and Methods", filed on the same day and having the same inventors as the present application; U.S. Pat. No. 6,690,176, issued Feb. 10, 2004, by Stanley S. Toncich, entitled "Low Loss Tunable Ferro-Electric Device and Method of Characterization"; U.S. Pat. No. 6,765,540 B2, issued Jul. 20, 2004, by Stanley S. Toncich, entitled "Tunable Antenna Matching Circuit"; application Ser. No. 09/927,136, filed Aug. 10, 2001, by Stanley S. Toncich, entitled "Tunable Matching Circuit"; application Ser. No. 10/076,171, filed Feb. 12, 2002, by Stanley S. Toncich, entitled "Antenna Interface Unit"; and application Ser. No. 10/117,628, filed Apr. 4, 2002, by Stanley S. Toncich and Allen Tran, entitled "Ferroelectric Antenna and Method for Tuning Same".

BACKGROUND OF THE INVENTION

1. Field of the Invention

This invention generally relates to wireless communication and, more particularly, to wireless communication antennas.

2. Description of the Related Art

The size of portable wireless communications devices, such as telephones, continues to shrink, even as more functionality is added. As a result, the designers must increase the performance of components or device subsystems and reduce their size, while packaging these components in inconvenient locations. One such critical component is the wireless communications antenna. This antenna may be connected to a telephone transceiver, for example, or a global positioning system (GPS) receiver.

Wireless communications devices are known to use simple cylindrical coil or whip antennas as either the primary or secondary communication antennas. Inverted-F antennas are also popular. Many conventional wireless telephones use a monopole or single-radiator design with an unbalanced signal feed. This type of design is dependent upon the wireless telephone printed circuit boards groundplane and chassis to act as the counterpoise. A single-radiator design acts to reduce the overall form factor of the antenna. However, the counterpoise is susceptible to changes in the design and location of proximate circuitry, and interaction with proximate objects when in use, i.e., a nearby wall or the manner in which the telephone is held. As a result of the susceptibility of the counterpoise, the radiation patterns and communications efficiency can be detrimentally impacted. Even if a balanced antenna is used, so that the groundplanes of proximate circuitry are not required as an antenna counterpoise, radiation pattern and radiation-susceptible circuitry issues remain.

This problem is compounded when an antenna, or a group of antennas operate in a plurality of frequency bands. State-of-the-art wireless telephones are expected to operate in a number of different communication bands. In the US, the cellular band (AMPS), at around 850 megahertz (MHz), and the PCS (Personal Communication System) band, at around 1900 MHz, are used. Other communication bands include the PCN (Personal Communication Network) and DCS at approximately 1800 MHz, the GSM system (Groupe Speciale Mobile) at approximately 900 MHz, and the JDC (Japanese Digital Cellular) at approximately 800 and 1500 MHz. Other bands of interest are GPS signals at approximately 1575 MHz, Bluetooth at approximately 2400 MHz, and wideband code division multiple access (WCDMA) at 1850 to 2200 MHz.

To dampen the effects of radiation upon proximate circuitry it is known to attach so-called bracket, or radiation-parasitic, elements to a groundplane. Typically, these "brackets" are used to evenly distribute current through the groundplane associated with a radiated wave. Alternately stated, the brackets are used to prevent any particular spot on a circuit board, chassis, or keyboard from becoming too sensitive to radiation-induced current. It is difficult, if not impossible, to design a wireless device to minimize the interaction between antenna radiation and susceptible circuitry in every one of its communication bands. As a result, a conventional design must be optimized for one particular communication band, or the design must be compromised to have for some (minimal) effect in every communication band of interest.

It would be advantageous if groundplane sensitivity to radiation-induced current could be minimized for every frequency of operation.

It would be advantageous if groundplane sensitivity to radiation-induced current could be tuned in response to changes in frequency, or in response to one particular area becoming too sensitive.

It would be advantageous if radiation desensitivity brackets could be made reconfigurable, to minimize the sensitivity of proximate circuitry at every frequency of radiation.

SUMMARY OF THE INVENTION

The present invention describes a reconfigurable radiation desensitivity bracket that can be added to the groundplane of a circuit proximate to a radiation source, to minimize the effects of radiation-induced currents. The bracket can be selectively tuned or switched in response to changes in frequency. Alternately considered, the bracket is space-reconfigurable to selectively redistribute current flow through the groundplane associated with radiated waves.

Accordingly, a method is presented for reconfigurable radiation desensitivity. The method comprises: accepting a radiated wave from a source such as a transmitter, antenna, microprocessor, electrical component, integrated circuit, camera, connector, or signal cable; in response to the radiated wave, creating a first current per units square (I/units$^2$) through a groundplane of an electrical circuit such as a printed circuit board (PCB), display, connector, or keypad; accepting a control signal; and, in response to the control signal, creating a second I/units$^2$ through the groundplane, different from the first I/units$^2$. For example, the second I/units$^2$ can be made significantly smaller if the groundplane is coupled to a bracket having a selectable effective electrical length.

Typically, the groundplane is coupled to a bracket with a fixed physical length section to provide a combined effective electrical length responsive to the fixed physical length and the selectable effective electrical length. The coupling mechanism can be through a transistor, or as a result of p/n junction coupling, selectable capacitive coupling, or mechanically bridging. In one aspect, the groundplane is coupled to a bracket with a plurality of selectable electrical length sections, which permits series connections, parallel connections, or combinations of series and parallel connection configurations. In other aspects, the groundplane is coupled to a bracket with a plurality of fixed physical length sections.

Additional details of the above-described method and a device with a reconfigurable radiation desensitivity bracket are provided below.

DETAILED DESCRIPTION OF THE PREFERRED EMBODIMENTS

Figure 1:
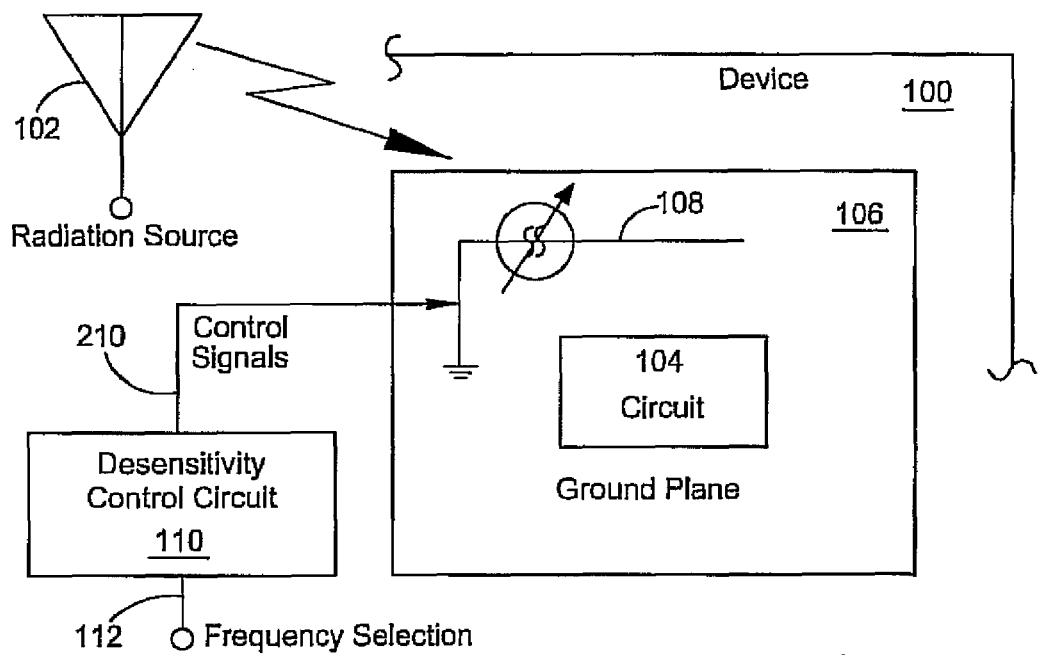
FIG. 1 is a schematic block diagram of the present invention device with a reconfigurable radiation desensitivity bracket.

FIG. 1 is a schematic block diagram of the present invention device with a reconfigurable radiation desensitivity bracket. The device 100 comprises a radiation source 102 and an electrical circuit 104 having a groundplane 106. A reconfigurable radiation desensitivity bracket 108 is coupled to the groundplane 106. The electrical circuit 104 may be components, such as integrated circuits (ICs), resistors, transistors, and the like, mounted on a printed circuit board (PCB). Otherwise, the electrical circuit 104 may be a display, a connector, or keypad, to name a few examples. The radiation source 102 may be a transmitter, antenna, microprocessor, electrical component, camera, connector, signal cable, or IC, to name a few conventional sources.

Two primary uses of the present invention bracket are for use in a portable or base station wireless device, where circuitry is susceptible to radiating elements such as an antenna, transmitter, transmitter component such as a transistor, inductor, resistor, or changes in the environment around a radiating element, to list a few examples. For example, unshielded receiver circuitry is known to be susceptible to radiating elements. Another use for the bracket is in microprocessor-driven computing devices, such as a personal computer. Here, susceptible circuitry can be protected, using the present invention bracket, from a radiation source such as a power supply, high-speed ICs, or network interfaces.

One general purpose of the bracket 108 is to evenly distribute groundplane currents that are generated as a result of radiated emissions, or confine the currents to predetermined areas of the groundplane. For this reason, the bracket 108 is termed a radiation desensitivity bracket, as radiation-generated current flow through a groundplane often makes a device susceptible to proximate objects that interrupt and modify current flow patterns. That is, the bracket acts to distribute current flow so as make the groundplane less susceptible to proximate objects. In other aspects, the bracket can be used to intentionally direct radiation-induced current flow to particular areas of the groundplane, for example, to a shielded area of the groundplane that is not susceptible to proximate objects such as a user's hand or a wall that may be temporarily located nearby.

Figure 2:
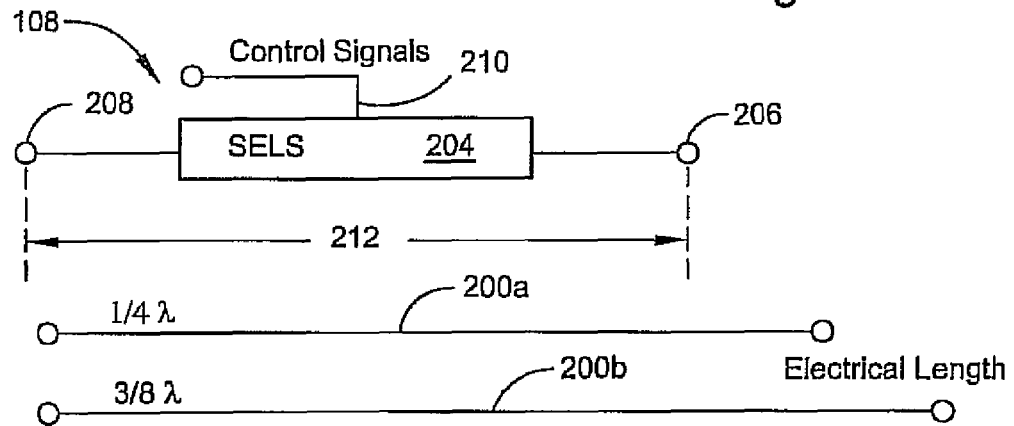
FIG. 2 is a schematic block diagram of the bracket of FIG. 1.

FIG. 2 is a schematic block diagram of the bracket 108 of FIG. 1. Generally, the bracket 108 has a selectable effective electrical length 200. The electrical length 200 is the measurement of wavelength, or wavelength portion. The electrical length is directly proportional to frequency, and is modified by the dielectric constant of the material through which the radiated wave travels to reach the bracket 108. For example, the bracket may be tuned to have either an electrical length 200a or electrical length 200b. As can be appreciated by those skilled in the art, the bracket, in combination with the attached groundplane, forms parasitic element that has a radiation susceptance or sensitivity that is dependent upon the frequency of radiation. That is, the interaction of a radiated wave with the groundplane/bracket combination is dependent upon the electrical length of the bracket. Every bracket 108 includes a selectable electrical length section 204 having a distal end 206, a proximal end 208, a control input on line 210 to accept control signals, and a selectable effective electrical length 200 responsive to the control signals on line 210. The bracket is termed configurable in that it may include switch elements, tunable elements, or both. As explained in detail below, the electrical length of the bracket can be manipulated using either the switchable or tunable elements.

The selectable electrical length section (SELS) 204 can be a coupling element such as FET, bipolar transistor, PIN diode, ferroelectric capacitor, varactor diode, or microelectromechanical system (MEMS) switch. The electric length of the SELS 204 is dependent upon more than just the physical length 212 of the section. That is, the coupling action of the SELS 204 includes a reactance or imaginary impedance component that can be varied to change the electrical length. Note, a MEMS switch may be used a variable gap capacitor by partially closing the switch.

Returning to FIG. 1, a desensitivity control circuit 110 has an input on line 112 to accept frequency selection commands and an output on line 210, connected to the selectable effective length section 204. The desensitivity control circuit 110 supplies control signals in response to the frequency selection commands.

Figure 3:
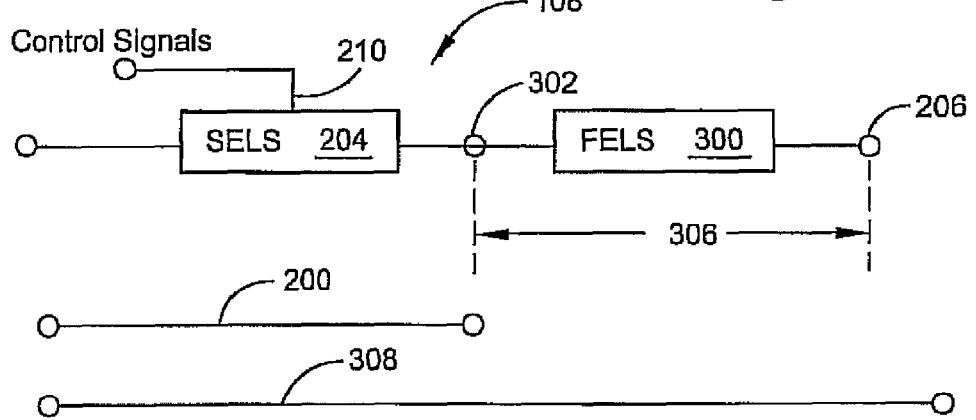
FIG. 3 is a schematic block diagram of a first variation of the bracket of FIG. 1.

FIG. 3 is a schematic block diagram of a first variation of the bracket 108 of FIG. 1. In this variation, the bracket 108 further includes a fixed electrical length section (FELS) 300 having a distal end 302, a proximal end 304, and a fixed physical length 306. The combination of the selectable electrical length section 204 and the fixed electrical length section 300 provides a combined selectable effective electrical length 308 responsive to the control signal on line 210. That is, the overall electrical length 308 is a combination of the physical length 306 of the FELS 300 and the electrical length 200 of the SELS 204, which may be physical length, if enabled as a MEMS for example, or a reactance, if enabled as a varactor diode for example.

Figure 4:
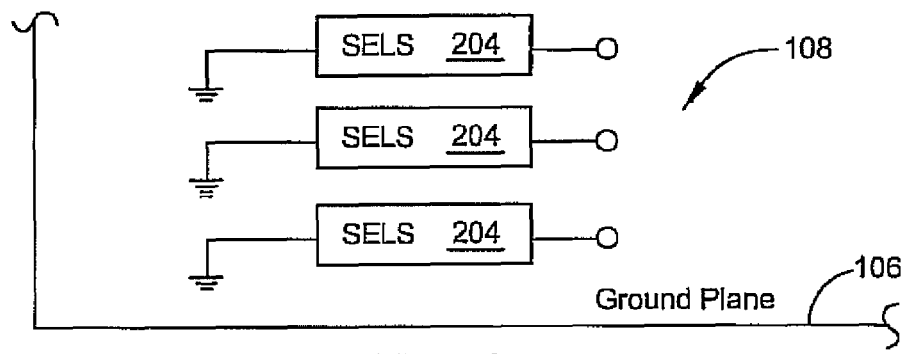
FIG. 4 is a schematic block diagram of a second variation of the bracket of FIG. 1.

FIG. 4 is a schematic block diagram of a second variation of the bracket 108 of FIG. 1. The bracket 108 may include a plurality of selectable electrical length sections 204. Although three SELS' 204 are shown, the invention is not limited to any particular number. As shown, the SELS' 204 are connected to the groundplane 106.

Figure 5:
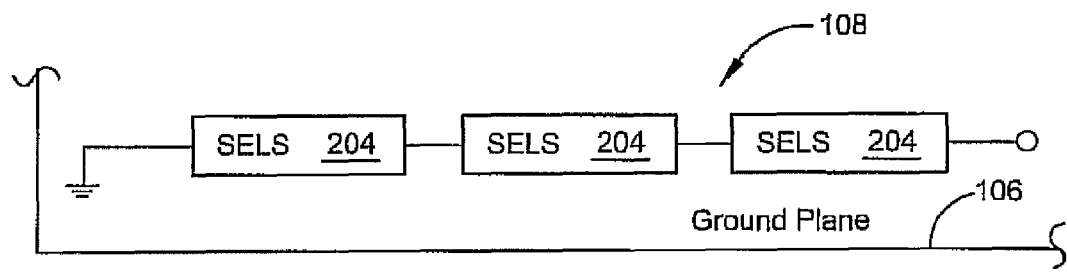
FIG. 5 is a schematic block diagram of a third variation of the bracket of FIG. 1.

FIG. 5 is a schematic block diagram of a third variation of the bracket 108 of FIG. 1. As shown, the three SELS' 204 are series-connected to the groundplane 106. Note, although the series of SELS' is shown as open-connected (unterminated), in other aspects both ends of the bracket 108 may be connected to the groundplane 106 or other circuitry (not shown). In other aspects not shown, the connections between individual SELS' 204 in the series may be terminated in the groundplane 106.

Figure 6:
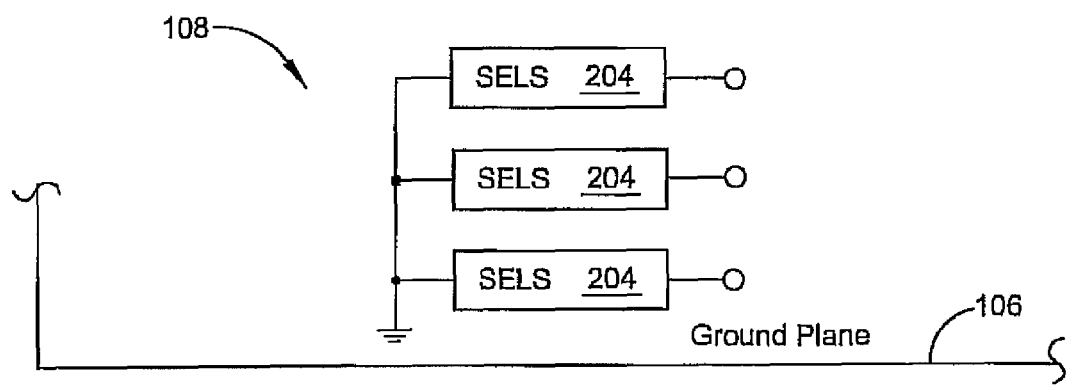
FIG. 6 is a schematic block diagram of a fourth variation of the bracket of FIG. 1.

FIG. 6 is a schematic block diagram of a fourth variation of the bracket 108 of FIG. 1. As shown, the three SELS' 204 are parallel-connected to the groundplane 106. In other aspects not shown, both ends of one or all the SELS' 204 may be terminated in the groundplane.

Figure 7:
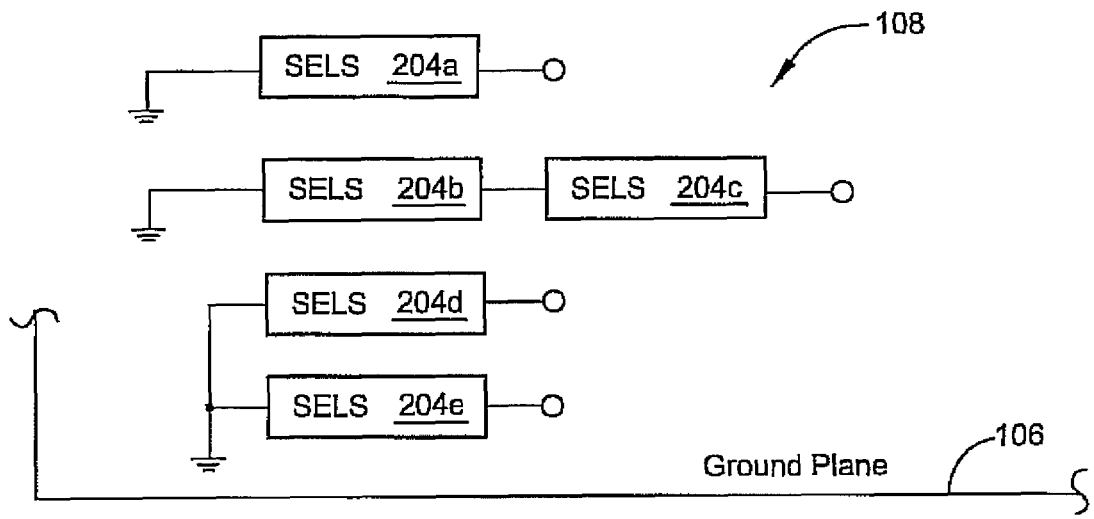
FIG. 7 is a schematic block diagram illustrating a fifth variation of the bracket of FIG. 1.

FIG. 7 is a schematic block diagram illustrating a fifth variation of the bracket 108 of FIG. 1. Here, SELS 204a is connected to the groundplane 106, SELS' 204b and 204c are series-connected to the groundplane 106, and SELS' 204d and 204e are parallel-connected to the groundplane 106. Note, although each configuration of SELS' 204 is shown as open-connected (unterminated), in other aspects both ends of each configuration may be connected to the groundplane 106 or other circuitry (not shown).

Figure 8:
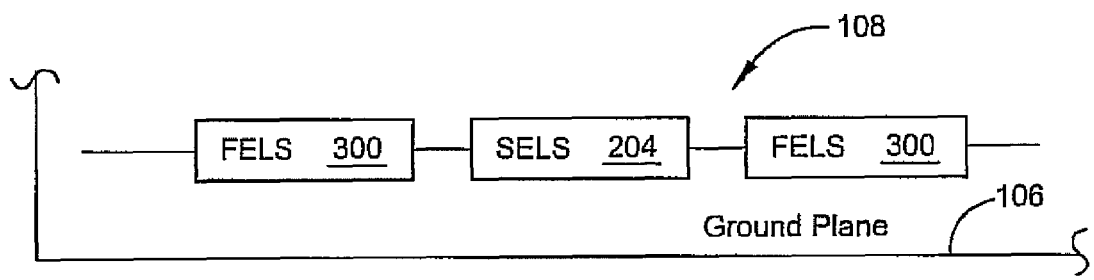
FIG. 8 is a schematic block diagram of a sixth variation of the bracket of FIG. 1.

FIG. 8 is a schematic block diagram of a sixth variation of the bracket 108 of FIG. 1. In this aspect, the bracket 108 includes a plurality of fixed electrical length sections 300. As shown, two FELS' 300 are series-connected through an intervening SELS 204. Note, although the series of sections is shown as open-connected (unterminated), in other aspects both ends of the bracket may be connected to the groundplane 106 or other circuitry (not shown), or the connections between sections may be terminated in the groundplane 106.

Figure 9:
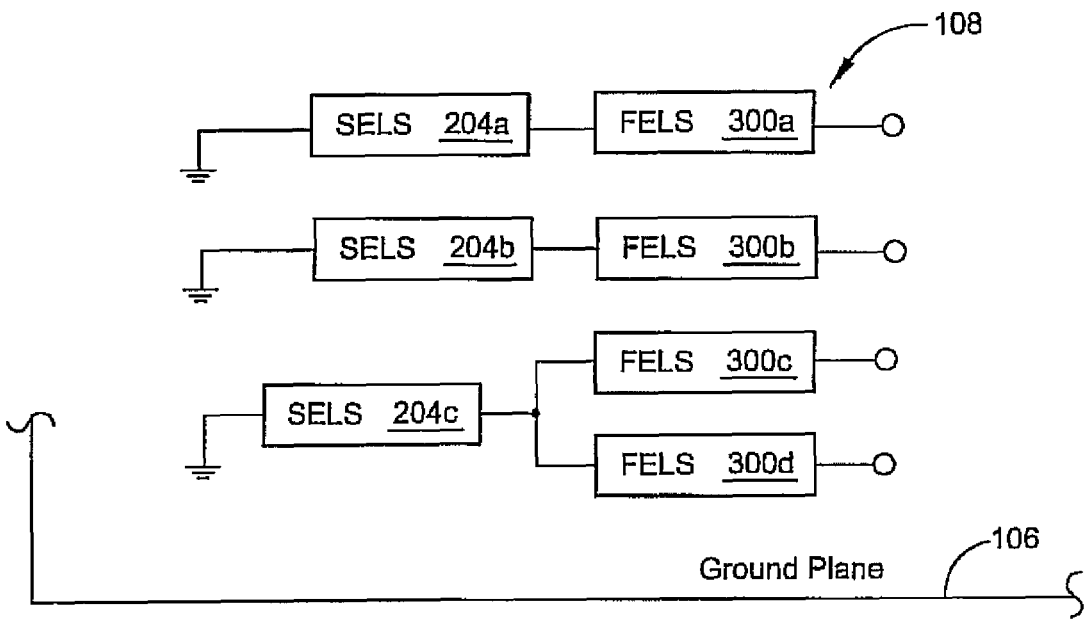
FIG. 9 is a schematic block diagram illustrating a seventh variation of the bracket of FIG. 1.

FIG. 9 is a schematic block diagram illustrating a seventh variation of the bracket 108 of FIG. 1. As shown, FELS 300a and 300b are parallel-connected to the groundplane 106 through separate SELS' 204a and 204b, respectively. Alternately, FELS' 300c and 300d are parallel-connected through a single SELS 204c. Note, although each configuration of sections is shown as open-connected (unterminated), in other aspects both ends of each configuration may be connected to the groundplane 106 or other circuitry (not shown).

Figure 10:
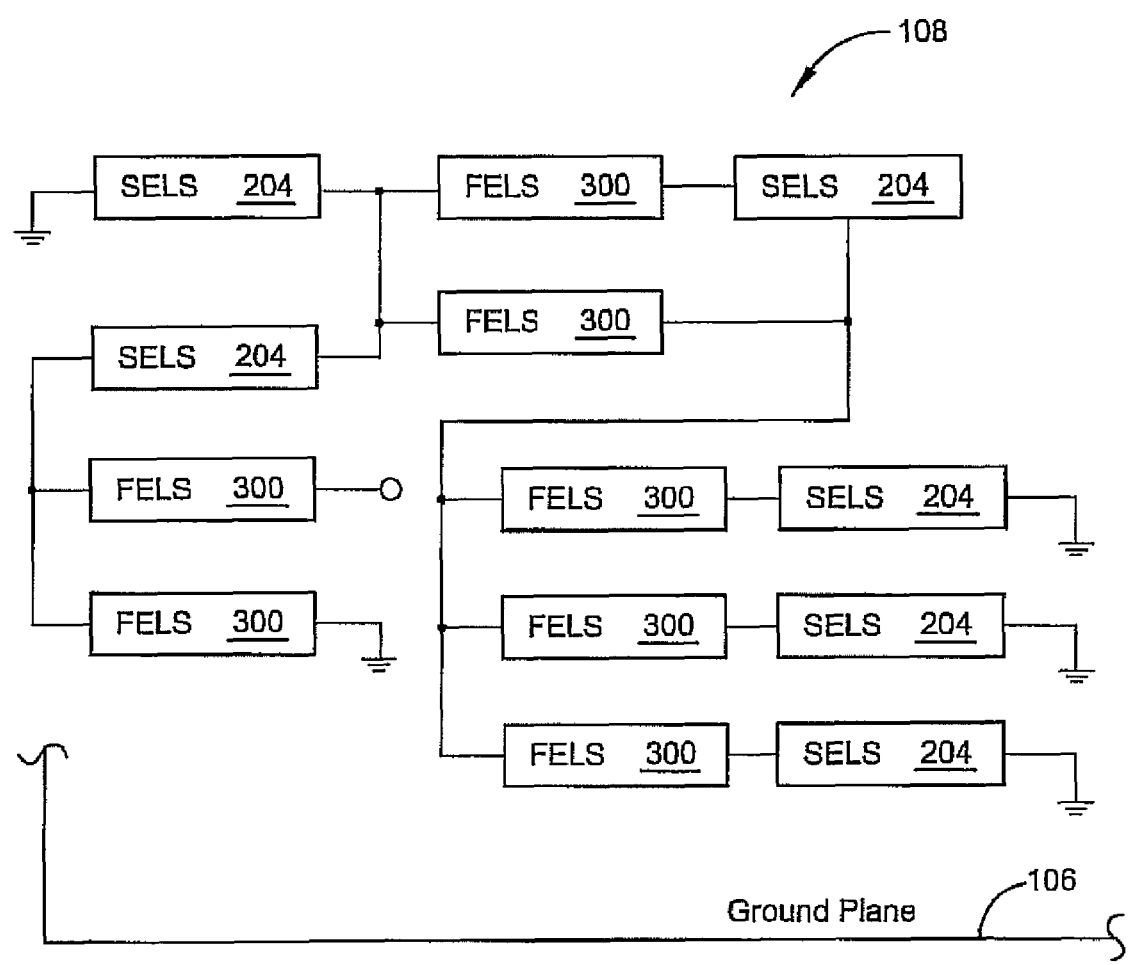
FIG. 10 is a schematic diagram illustration some combinations of series-connected and parallel-connected FELS.

FIG. 10 is a schematic diagram illustration some combinations of series-connected and parallel-connected FELS' 300.

Figure 11:
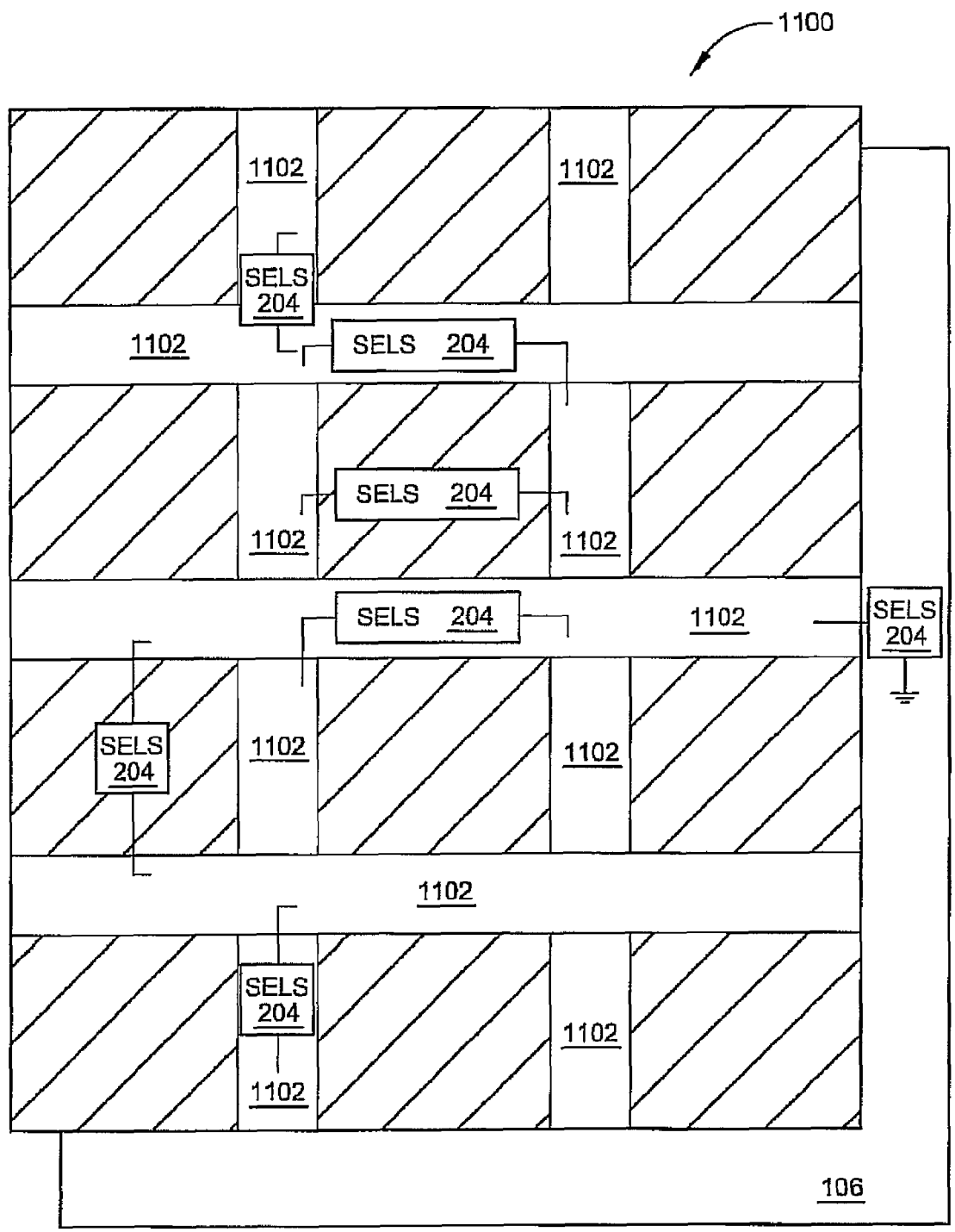
FIG. 11 is a plan view schematic diagram illustrating a bracket design where a plurality of fixed electrical length sections form a matrix of adjoining conductive areas.

FIG. 11 is a plan view schematic diagram illustrating a bracket design 1100 where a plurality of fixed electrical length sections form a matrix of adjoining conductive areas 1102. For example, the adjoining conductive areas may part of a wireless device keyboard that is mounted overlying PCB groundplane 106. The spaces, represented with cross-hatched lines, are the individual keypads. In this aspect, the adjoining conductive areas 1102 are the FELS'. The bracket 1100 also includes a plurality of selectable electrical length sections 204 that are used to couple between fixed electrical length sections 1102. A variety of connection configurations are shown, but the examples are not exhaustive of every possible combination. At least one of the selectable electrical length sections 204 is coupled to the groundplane 106. Alternately, a FELS, enabled as a screw or wire (not shown), for example, may connect the bracket 1100 to the groundplane 106.

Figure 12:
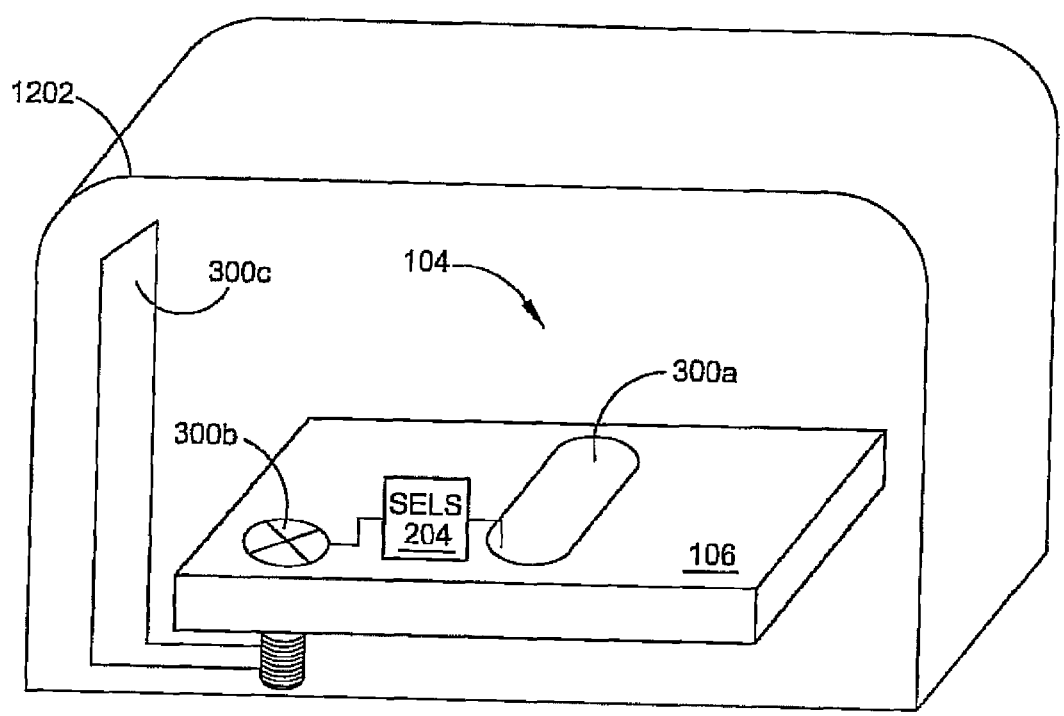
FIG. 12 is a perspective cutaway view illustrating a bracket chassis design.

FIG. 12 is a perspective cutaway view illustrating a bracket chassis design 1200. A chassis 1202 surrounds the electrical circuit 104, and functions as a bracket element. A third fixed electrical length section 300c is a conductive trace, conductive paint, or plating formed on the chassis 1200, coupled to the groundplane 106 through a SELS 204. As shown, SELS 204 is connected to a first FELS 300a, enabled as a conductive trace of a PCB, a second FELS 300b, enabled as a screw, connects FELS 300a to 300c. In other aspects, the FELS 300b can be a spring-loaded clips, pogo pin, or a conductive pillow (gasket). A variety of other bracket configurations are possible that make use of the chassis as a bracket element, as would be understood by those skilled in the art in light of the above-mentioned examples.

Figure 13:
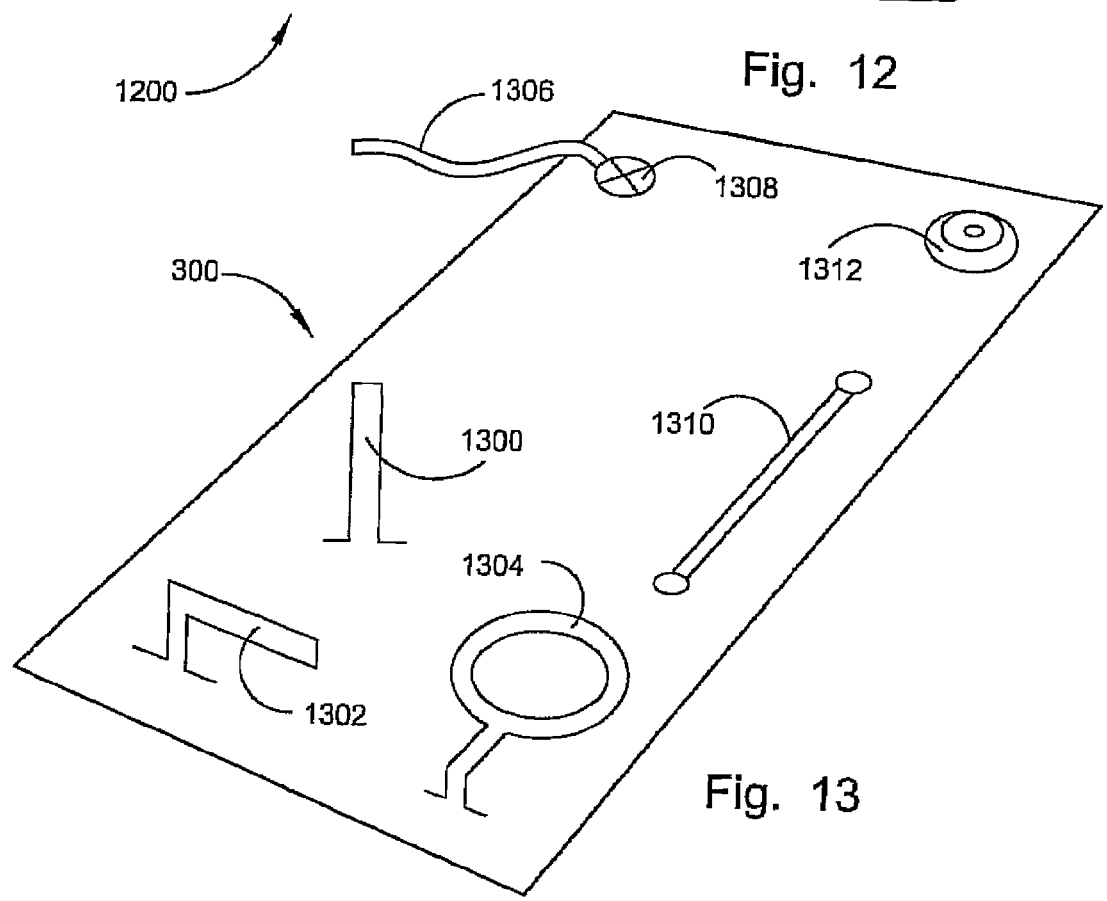
FIG. 13 is a perspective drawing illustrating some exemplary FELS variations.

FIG. 13 is a perspective drawing illustrating some exemplary FELS variations. The FELS 300 can be a conductive metal member that is soldered or tension mounted to a bracket or groundplane. The metal form can be straight 1300, L-shaped 1302, or O-shaped member 1304. Other shapes, or combinations of shapes are possible. Some shapes are dependent upon the surrounding area available. In addition, the FELS may be a wire 1306, a fastener, such as a screw 1308, conductive pillow (gasket) 1312, or a conductive element trace or paint 1310 formed on a PCB or chassis. These are just a few examples of FELS elements. Any element capable of conducting an electrical current is potentially capable of acting as a FELS.

Functional Description

Figure 14A:
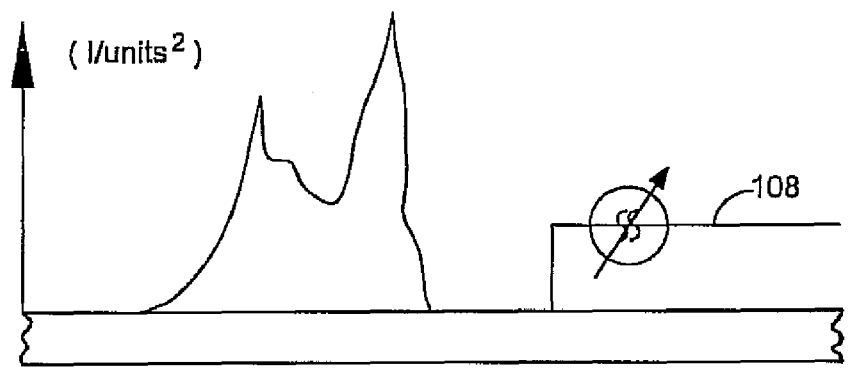
FIGS. 14A and 14B are diagrams illustrating the present invention bracket redistributing radiation-induced current flow in a groundplane.
Figure 14B:
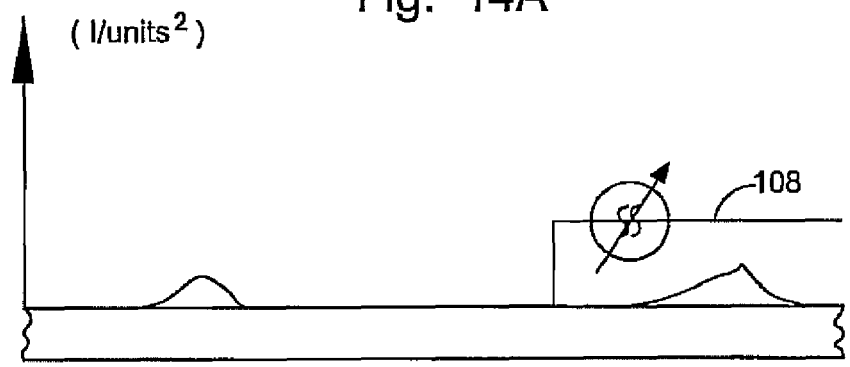

FIGS. 14A and 14B are diagrams illustrating the present invention bracket redistributing radiation-induced current flow in a groundplane. The vertical dimension illustrates current flow (I). The current through an area (unite) is one possible measure of current or current distribution, for example, $A/in^2$. However, other measurements of current can be used to illustrate the invention. In FIG. 14A, a relatively high current flow in shown in one particular region as a result of a source radiating at 890 MHz. In response to enabling the bracket 108, the current flow is redistributed, as shown in FIG. 14B. The bracket may be considered frequency reconfigurable, as a different electrical length may be used for different radiated frequencies. Alternately, the bracket may be considered space-reconfigurable, as it can be used to redistribute current flow to different regions of the groundplane. For example, the bracket 108 may be tuned to redistribute current (as shown in FIG. 14A) after device is moved near a proximate object, to create the current pattern shown in FIG. 14B.

Figure 15:
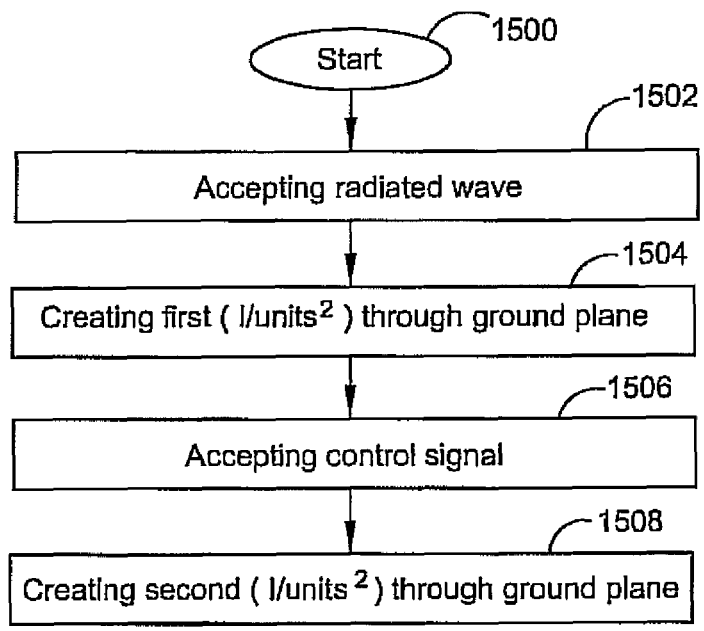
FIG. 15 is a flowchart illustrating the present invention method for reconfigurable radiation desensitivity.

FIG. 15 is a flowchart illustrating the present invention method for reconfigurable radiation desensitivity. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1500.

Step 1502 accepts a radiated or transmitted wave. Step 1504, in response to the radiated wave, creates a first current per units square (I/units$^2$) through a groundplane of an electrical circuit. That is, current flow is induced as a result of the wave radiated in Step 1502. Step 1506 accepts a control signal. Step 1508, in response to the control signal, creates a second I/units$^2$ through the groundplane, different from the first I/units$^2$. Alternately stated, the I/units$^2$ is either frequency or space-reconfigurable, as mentioned above. As noted above, the choice of the current-related measurement is somewhat arbitrary, and the invention can also be expressed in other units of measurement related to current, energy, or field strength.

Step 1502 accepts a radiated wave from a source such as a transmitter, antenna, microprocessor, electrical component, integrated circuit, camera, connector, and signal cable. Step 1504 creates the first I/units$^2$ through a groundplane of an electrical circuit such as components mounted on a printed circuit board (PCB), display, connector, or keypad.

In one aspect, Step 1508 creates a second I/units$^2$ through the groundplane of an electrical circuit by coupling the groundplane to a bracket having a selectable effective electrical length. Further, groundplane can be coupled to a bracket with a fixed physical length section to provide a combined effective electrical length responsive to the fixed physical length and the selectable effective electrical length.

In other aspects, Step 1508 couples the groundplane to a bracket with a plurality of selectable electrical length sections. For example, the plurality of selectable electrical length sections can be coupled in a configuration such as connected to the groundplane, series-connected, parallel-connected, or combinations of the above-mentioned connection configurations. Likewise, Step 1508 may couple the groundplane to a bracket with a plurality of fixed physical length sections. Again, the plurality of fixed electrical length sections may be connected to the groundplane, series-connected, parallel-connected, or combinations of the above-mentioned connection configurations.

In a different aspect, Step 1508 couples through a mechanism such as transistor coupling, p/n junction coupling, selectable capacitive coupling, variable gap coupling, or mechanically bridging. For example, a transistor may act as a switch, buffer, current amplifier, voltage amplifier, or reactance element. The transistor coupling may be accomplished with a bipolar transistor or FET. The p/n junction coupling may be accomplished with a PIN diode. The capacitive coupling may be accomplished with a varactor diode or ferroelectric capacitor, and the mechanical bridging may be accomplished with a MEMS or other type of mechanical switch. The variable gap coupling may be enabled using a MEMS switch.

A device with a reconfigurable radiation desensitivity bracket, and corresponding reconfigurable radiation desensitivity method have been provided. Some examples of specific bracket shapes and schematic arrangements have been presented to clarify the invention. Likewise, some specific physical implementations and uses for the invention have been mentioned. However, the invention is not limited to just these examples. Other variations and embodiments of the invention will occur to those skilled in the art.

We claim:

1. A method for reconfigurable radiation desensitivity, the method comprising:
   accepting a radiated wave;
   in response to the radiated wave, creating a first current per units square (I/units$^2$) through a groundplane of an electrical circuit;
   accepting a control signal; and,
   in response to the control signal, creating a second I/units$^2$ through the groundplane, different from the first I/units$^2$, wherein creating the second I/units$^2$ comprises coupling the groundplane to a bracket having a selectable effective electrical length and comprising a fixed physical length section and a plurality of selectable electrical length sections.

2. The method of claim 1 wherein creating a first I/units$^2$ through the groundplane of an electrical circuit includes creating a first I/units$^2$ through a groundplane of an electrical circuit selected from the group including components mounted on a printed circuit board (PCB), display, connector, and keypad.

3. The method of claim 1 wherein accepting a radiated wave includes accepting a radiated wave from a source selected from the group including a transmitter, antenna, microprocessor, electrical component, integrated circuit, camera, connector, and signal cable.

4. The method of claim 1 wherein coupling the groundplane to the bracket having the selectable effective electrical length comprises coupling the groundplane to the bracket to provide a combined effective electrical length responsive to the fixed physical length and a selected electrical length.

5. The method of claim 1 wherein coupling the groundplane to a bracket with a plurality of selectable electrical length sections includes connecting the plurality of selectable electrical length sections in a configuration selected from the group including connected to the groundplane, series-connected, parallel-connected, and combinations of the above-mentioned connection configurations.

6. The method of claim 1 wherein coupling the groundplane to a bracket having a selectable effective electrical length includes coupling the groundplane to a bracket with a plurality of fixed physical length sections.

7. The method of claim 6 wherein coupling the groundplane to a bracket with a plurality of fixed physical length sections includes connecting the plurality of fixed electrical length sections to a selectable electrical length section in a configuration selected from the group including connected to the groundplane, series-connected, parallel-connected, and combinations of the above-mentioned connection configurations.

8. The method of claim 1 wherein coupling the groundplane to a bracket having a selectable effective electrical length includes coupling through a mechanism selected from the group including transistor coupling, p/n junction coupling, selectable capacitive coupling, variable gap coupling, and mechanically bridging.

9. A method comprising:
   in response to a control signal, redistributing a radiation-induced current distribution through a groundplane by coupling the groundplane to a bracket having a selectable electrical length and comprising a fixed electrical length section and a plurality of selectable electrical lengths sections.

10. The method of claim 9, wherein the radiation-induced current results from radiation of a source selected from the group including a transmitter, antenna, microprocessor, electrical component, integrated circuit, camera, connector, and signal cable.

11. The method of claim 9, wherein the groundplane is a groundplane of an electrical circuit selected from the group including components mounted on a printed circuit board (PCB), display, connector, and keypad.

12. The method of claim 9 wherein coupling the groundplane to the bracket comprises coupling the groundplane to the bracket to provide a combined effective electrical length responsive to the fixed physical length and a selected electrical length.

13. The method of claim 9, wherein coupling the groundplane to a bracket comprises connecting at least some of the plurality of selectable electrical length sections in connections including series-connections, parallel-connections, connections to the groundplane and all combinations thereof.

14. The method of claim 9 wherein coupling the groundplane to a bracket having a selectable effective electrical length includes coupling the groundplane to a bracket with a plurality of fixed physical length sections.

15. The method of claim 14 wherein coupling the groundplane to a bracket with a plurality of fixed physical length sections includes connecting the plurality of fixed electrical length sections to a selectable electrical length section in a configuration selected from the group including connected to the groundplane, series-connected, parallel-connected, and combinations thereof.

16. The method of claim 9 wherein coupling the groundplane to a bracket having a selectable effective electrical length includes coupling through a mechanism selected from the group including transistor coupling, p/n junction coupling, selectable capacitive coupling, variable gap coupling, and mechanically bridging.

17. The method of claim 9, wherein the radiation-induced current distribution is a first current per area distribution through the groundplane and wherein redistributing the radiation-induced current distribution comprises causing a second current per area distribution through the groundplane.

* * * * *